(12) United States Patent
Holroyd

(10) Patent No.: US 11,943,880 B2
(45) Date of Patent: Mar. 26, 2024

(54) INTERLOCKING DISPLAY

(71) Applicant: Lenovo (United States) Inc., Morrisville, NC (US)

(72) Inventor: William Holroyd, Cary, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 17/708,290

(22) Filed: Mar. 30, 2022

(65) Prior Publication Data
US 2023/0320001 A1 Oct. 5, 2023

(51) Int. Cl.
*H05K 5/00* (2006.01)

(52) U.S. Cl.
CPC ......... *H05K 5/0021* (2013.01); *H05K 5/0017* (2013.01)

(58) Field of Classification Search
CPC ... H05K 5/0021; H05K 5/0017; H05K 5/0217
USPC ................................. 361/732, 759, 801, 803
See application file for complete search history.

(56) References Cited

U.S. PATENT DOCUMENTS

| | | | | | |
|---|---|---|---|---|---|
| 5,588,240 | A | * | 12/1996 | Zilliox | G09F 1/12 40/605 |
| 5,600,910 | A | * | 2/1997 | Blackburn | F21S 2/005 40/605 |
| 7,246,780 | B2 | * | 7/2007 | Oddsen, Jr. | F16M 13/02 248/125.7 |
| 10,834,843 | B1 | * | 11/2020 | Erie | H05K 7/1491 |
| 2003/0015632 | A1 | * | 1/2003 | Dunn | F16M 11/10 248/122.1 |
| 2003/0146359 | A1 | * | 8/2003 | Oddsen, Jr. | F16M 11/2092 248/278.1 |
| 2009/0072691 | A1 | * | 3/2009 | Green | F16B 12/46 403/364 |
| 2014/0007471 | A1 | * | 1/2014 | Ottolenghi | A47B 87/0292 264/219 |
| 2022/0053652 | A1 | * | 2/2022 | Chen | G09F 9/33 |

FOREIGN PATENT DOCUMENTS

CN 201367714 * 12/2009 ............. E04F 15/04

* cited by examiner

*Primary Examiner* — Hung S. Bui
(74) *Attorney, Agent, or Firm* — Brian J. Pangrle

(57) ABSTRACT

A display can include a rectangular display panel; and a housing that includes a rectangular frame that surrounds the display panel, where a short edge of the rectangular frame includes keys and keyways.

20 Claims, 14 Drawing Sheets

INTERLOCKING DISPLAY

TECHNICAL FIELD

Subject matter disclosed herein generally relates to technology for computing systems, display systems or other systems.

BACKGROUND

Various types of systems, display systems, computing and display systems, etc. exist that include stands.

SUMMARY

A display can include a rectangular display panel; and a housing that includes a rectangular frame that surrounds the display panel, where a short edge of the rectangular frame includes keys and keyways. Various other apparatuses, systems, methods, etc., are also disclosed.

BRIEF DESCRIPTION OF THE DRAWINGS

Features and advantages of the described implementations can be more readily understood by reference to the following description taken in conjunction with examples of the accompanying drawings.

DETAILED DESCRIPTION

The following description includes the best mode presently contemplated for practicing the described implementations. This description is not to be taken in a limiting sense, but rather is made merely for the purpose of describing general principles of various implementations. The scope of invention should be ascertained with reference to issued claims.

Figure 1:
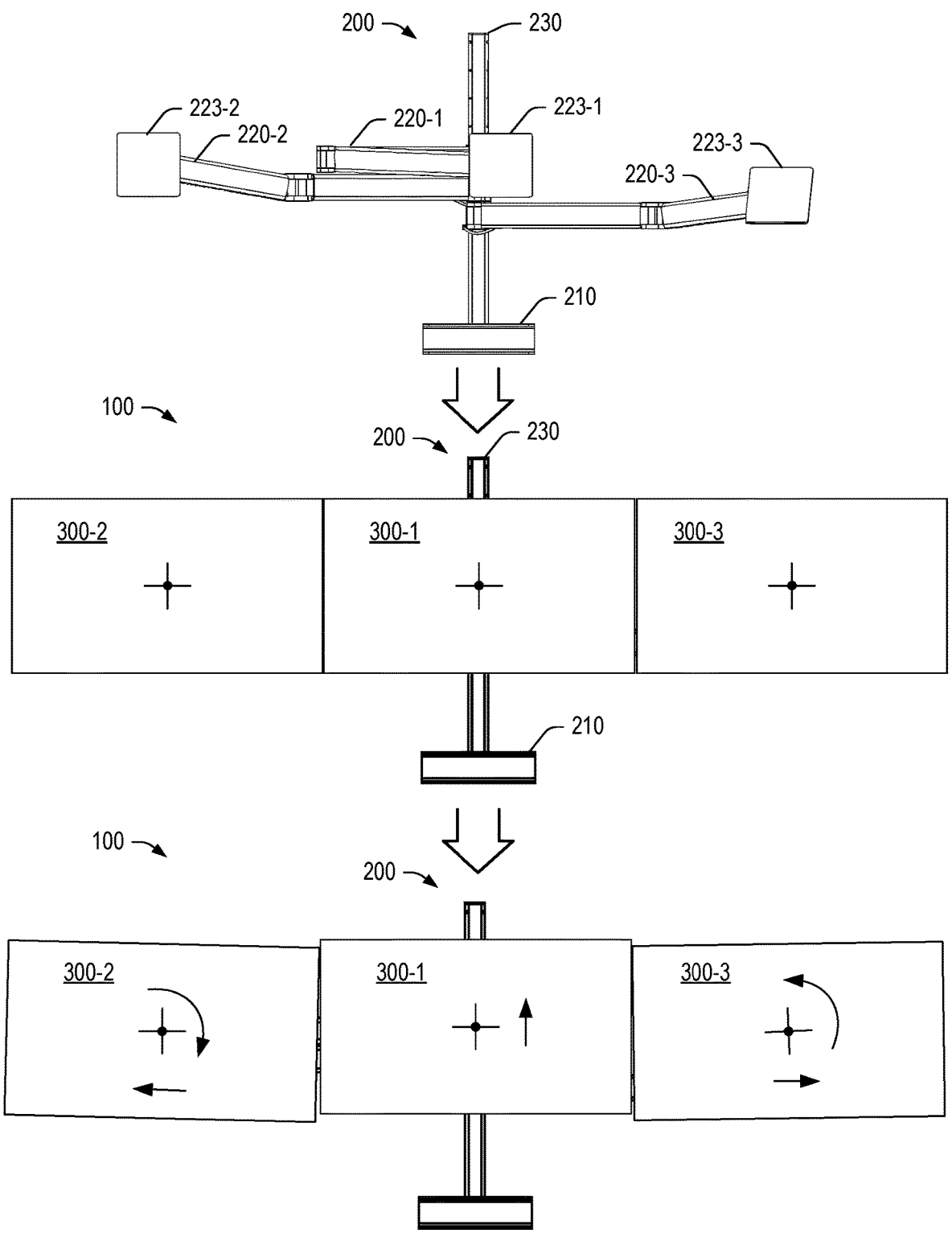
FIG. 1 is a perspective view of an example of a system.

FIG. 1 shows an example of a system 100 that includes a stand 200 that includes a base 210 and an upright 230 and two or more arms 220-1, 220-2 and 220-3 mountable to the upright 230 where each of the arms 220-1, 220-2 and 220-3 includes a display mount 223-1, 223-2 and 223-3, which may be a standardized type of display mount. As an example, a display mount may be a VESA standard display mount or another type of display mount. As shown in FIG. 1, two or more displays 300-1, 300-2 and 300-3 can be carried by the stand 200 where each of the display mounts 223-1, 223-2 and 223-3 couples to a respective one of the displays 300-1, 300-2 and 300-3.

As to the VESA standard, it defines dimensions of a four-hole attachment interface on the back of displays and screws used to fit those holes. It also dictates the placement of the hole pattern on the display. For attachment to VESA mounts, ideally the standardized hole pattern can be centered on a display's back side as a center-positioned pattern can help to minimize torqueing forces applied to the mount, allowing it to hold a heavier load.

In the example of FIG. 1, the display mounts 223-1, 223-2 and 223-3 can be adjustable with various degrees of freedom (DoF) using mechanisms of the arms 220-1, 220-2 and 220-3 and/or mechanisms of the display mounts 223-1, 223-2 and 223-3 (e.g., joints, sliders, etc.). As to degrees of freedom (DoF), consider six total DoF in a 3D Cartesian coordinate space with x, y and z axes. With six DoF, three correspond to rotational movement around the x, y, and z axes, commonly termed pitch, yaw, and roll, while the other three correspond to translational movement along those axes, which can be thought of as moving forward or backward, moving left or right, and moving up or down.

As mentioned, in various instances, a hole pattern is centered on a display's back to minimize torque forces applied to a stand (e.g., via a mount on an arm). As to torque, the mass of a display can be a factor along with center of mass. The center of mass is the mean position of the mass in an object and the center of gravity is the point where gravity appears to act, which, for many objects, these two points are in exactly the same location as the gravitational field is typically uniform across an object.

As shown in FIG. 1, the stand 200 can be fit with the displays 300-1, 300-2 and 300-3 where a user may align the displays 300-1, 300-2 and 300-3 such that side edges are parallel; however, over some amount of time, one or more of the displays 300-1, 300-2 and 300-3 can move due to one or more forces such as gravitational force, vibrational force, contact force, etc., such that side edges of the different displays 300-1, 300-2 and 300-3 are no longer parallel. For example, as to gravitational force, movement responsive to torque may occur or creeping movement may occur. Torque may result in rotational and/or translational movement, depending on factors such as structural arrangement, number of joints, types of joints, etc. Creep can occur responsive to application of force where creep can result in elastic and/or plastic deformation of one or more components. As to vibrational force, consider vibration from machinery, typing on a keyboard, foot tapping, etc., that can be transferred to a stand and hence arms and display mounts. As to contact force, consider a user that makes contact with a stand, a display or displays when reaching for an object on a desk and/or when plugging and/or unplugging one or more cables (e.g., power, video, data, etc.).

As shown in FIG. 1, the displays 300-1, 300-2 and 300-3 can become misaligned for one or more reasons such that a user has to re-align them from time to time. In such an example, the user may learn to live with a stable state of the displays 300-1, 300-2 and 300-3 that is not an aligned state because the aligned state is transitory and does not last for a sufficiently long period of time.

Figure 2:
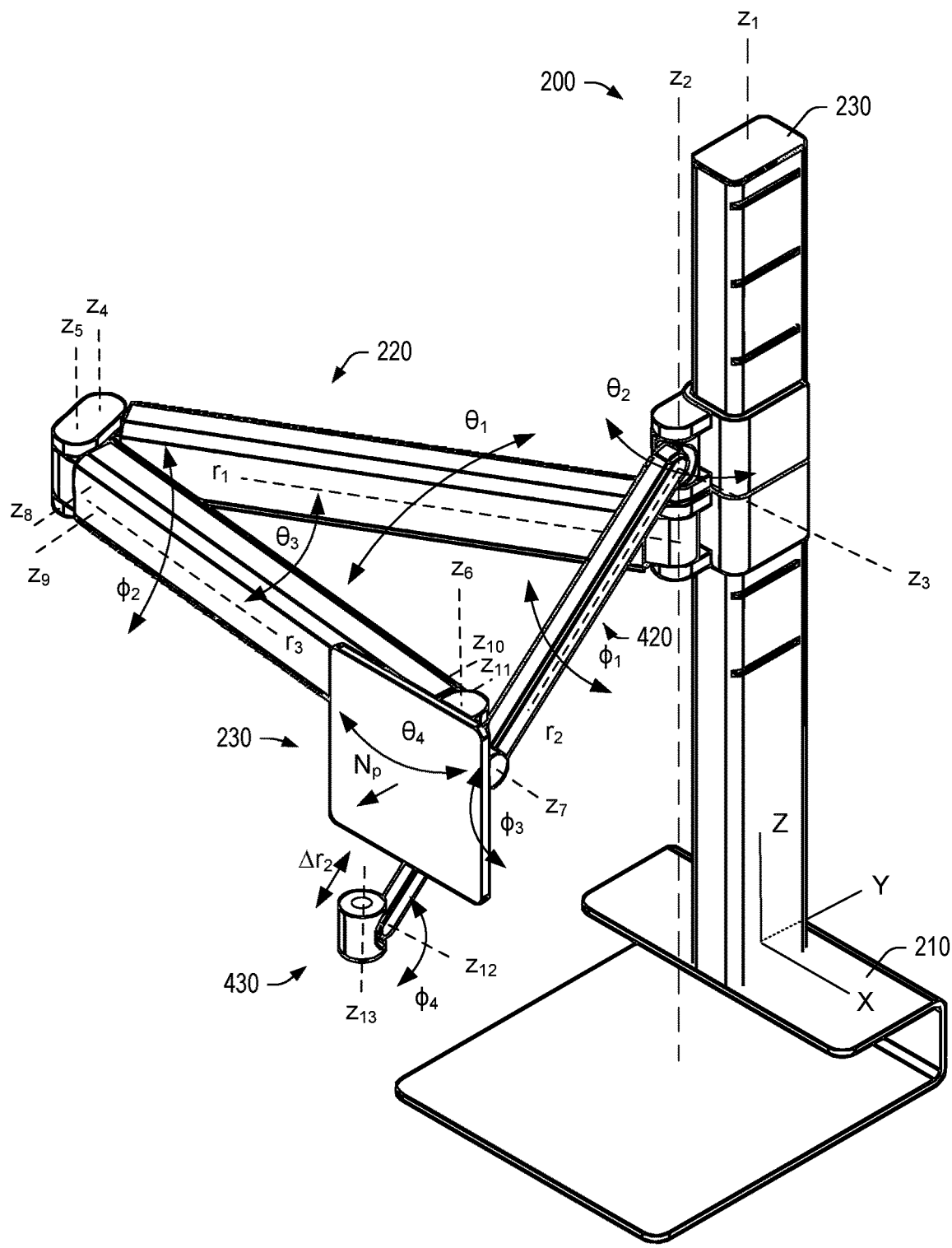
FIG. 2 is a perspective view of an example of a stand.

FIG. 2 shows an example of a portion of the stand 200 with an example of an accessory arm 420 with an accessory mount 430. As shown, the arm 220 includes a first member and a second member coupled via a joint and the arm 420 includes a first member and a second member where the second member can be telescoping. As shown, each of the arms 220 and 420 includes a respective mount assembly for coupling to the upright 230 of the stand 200.

In the example of FIG. 2, various coordinate system parameters are shown, including a Cartesian coordinate system with axes X, Y, and X, $z_1$ as an axis of the upright 230, $z_2$ as an axis of pin joints of the mount assemblies, $z_3$ as an axis of another pin joint of one of the mount assemblies, $z_4$ and $z_5$ as axes of a dual-axis hinge joint of the arm 220, axes $z_6$ and $z_7$ of the display mount 230, axes $z_8$, $z_9$, $z_{10}$ and $z_{11}$ of a four-bar linkage of the second member of the arm 220, and axes $z_{12}$ and $z_{13}$ of the accessory mount 430.

In the example of FIG. 2, an X,Y-plane can be substantially parallel and/or even with a surface of a desktop, a tabletop, a countertop, etc., which may be or include a workspace surface (e.g., for a mouse, a keyboard, etc.). As shown, the upright 230 can be perpendicular (e.g., normal) to the X,Y-plane and extending upwardly where the upright 230 includes various features for supporting one or more arms. In the example of FIG. 2, a series of features for supporting an arm or arms may be spaced axially along the upright 230. As to the base 210, it may be fixed or removable from the upright 230. For example, consider a base that is formed with an upright as a unitary piece, a base that is welded to an upright, a base that is bolted or otherwise removably connected to an upright, etc. In various instances, an upright may have a threaded socket, a threaded extension, etc., that may provide for connection to a threaded extension, a threaded socket, etc. (e.g., of a desktop, a tabletop, a countertop, a pole, etc.). As an example, an upright may be telescoping. For example, consider an upright with two members where one can extend axially with respect to the other where each of the two members may include features for coupling of an arm or arms and/or a port or ports (e.g., data and/or power).

In the example of FIG. 2, the various coordinate system parameters also include $r_1$ as a radial direction of the first member of the arm 220 as measured from the axis $z_2$ of a pin joint of the mount assembly of the arm 220, $r_2$ as a multiple degrees of freedom radial direction of the arm 420, and $r_3$ as a radial direction of the second member of the arm 220 as movable via the four-bar linkage of the second member. Various angles are also shown, including $\theta_1$ as an angle of the first member of the arm 220 with respect to the axis $z_2$, $\theta_2$ as an angle of the arm 420 with respect to the axis $z_2$, $\theta_3$ as an angle between the first and second members of the arm 220, and 84 as an angle of a plate of the display mount 230 with respect to the axis $z_6$. As illustrated, the "$\theta$" angles are in planes that can be defined as being parallel to each other where each respective "z" axis is normal to the corresponding plane. For example, consider cylindrical coordinate systems associated with each of the "z" axes where the "$\theta$" angles can be azimuthal coordinate angles. Other angles in the example of FIG. 2 are "$\phi$" angles, which include $\phi_1$ as an altitudinal angle of the arm 420 (e.g., as may be referenced to an altitudinal angle of the member of the arm 220), $\phi_2$ as an altitudinal angle of the display mount 230 and $\phi_3$ as an altitudinal angle of the accessory mount 430.

In the example of FIG. 2, the arm 420, as mentioned, can be telescoping. For example, the arm 420 can include the first member and the second member where the second member can be translatable with respect to the first member. For example, consider a dimension $\Delta r_2$ as indicating a translatable direction and dimension of the second member.

As shown, the first member is coupled to the upright 230 via the mount assembly, noting that the arm 420 may include more than two members that can provide for translatable adjustment.

As shown in the example of FIG. 2, the mount assembly of the arm 220 can be a single degree of freedom stand mount assembly that includes a pin joint where such a pin joint can include an axle (e.g., a pin) disposed at least in part in a bushing. The mount assembly of the arm 220 in FIG. 2 allows for one degree of freedom of movement of the first member of the arm 220 in a plane (e.g., a plane defined by $r_1$ and el). As mentioned, the second member can include a four-bar linkage that provides an additional degree of freedom (e.g., in a plane defined by $r_3$ and $\phi_3$). Further, one or more degrees of freedom may be provided via the display mount 230, which can be defined in part via a normal $N_p$, for example, a normal vector of a plate portion of the display mount 230. In such an example, the plate portion can be suitable for mounting of a display where the normal $N_p$ may correspond to a normal of a surface of the display. As an example, the arm 220 may be utilized for mounting of a display where various features of the arm 220, as mounted to the upright 230, provide for adjusting the display (e.g., up/down, left/right, tilt back/front, tilt side/side, etc.).

As shown in the example of FIG. 2, the mount assembly of the arm 420 can be a multiple degrees of freedom stand mount assembly that includes multiple pin joints. In such an example, each of the multiple pin joints can include an axle disposed at least in part in a bushing. As an example, the mount assembly of the arm 420 may include a ball joint. For example, consider a ball joint that includes at least a portion of a ball and at least a portion of a ball socket. In such an example, the ball joint may provide for various degrees of freedom (DoF) of movement of the first member of the arm 420.

Figure 3:
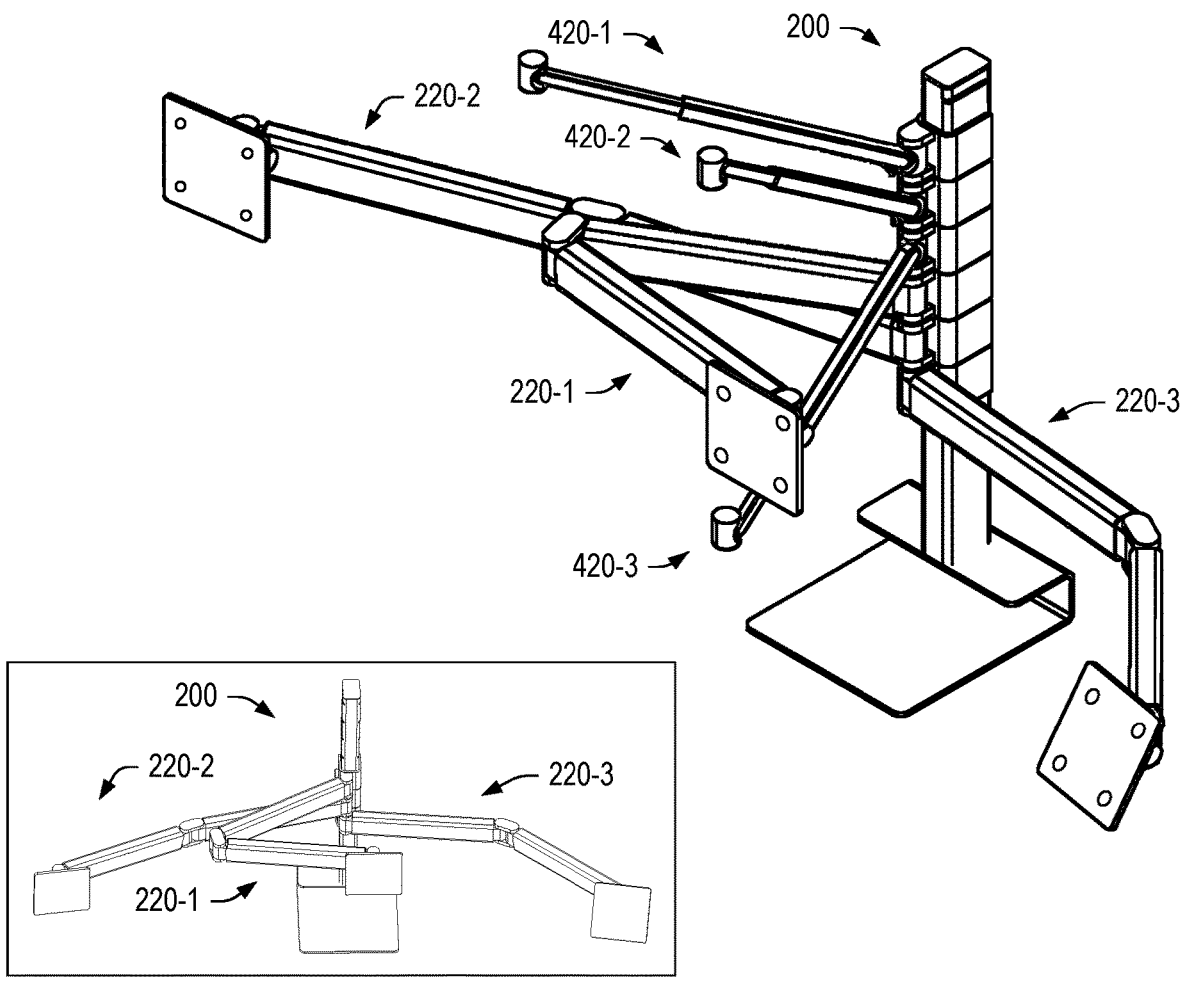
FIG. 3 is a series of perspective views of examples of a stand.

FIG. 3 shows the stand 200 as including at least two arms 220-1, 220-2 and 220-3 and optionally one or more accessory arms 420-1, 420-2 and 420-3. As explained, positions of displays, and one or more optional accessories, may change over time such that alignment is not maintained, if even initially achievable.

As explained, a stand can include various components that provide for mounting equipment (e.g., a display, displays, an accessory, accessories, etc.), where such components provide for various degrees of freedom (DoF). In such an approach, given some amount of independence as to mounts, equipment coupled to such mounts can move over time due to one or more physical phenomena (e.g., contact, torque, vibration, creep, etc.). In a stand such as the stand 200, friction, locking, directional movement, etc., of joints can differ and depend on mechanics, mass of equipment, etc., such that movement can occur that may change an aligned arrangement of equipment coupled to the stand to a misaligned arrangement of the equipment coupled to the stand.

Figure 4:
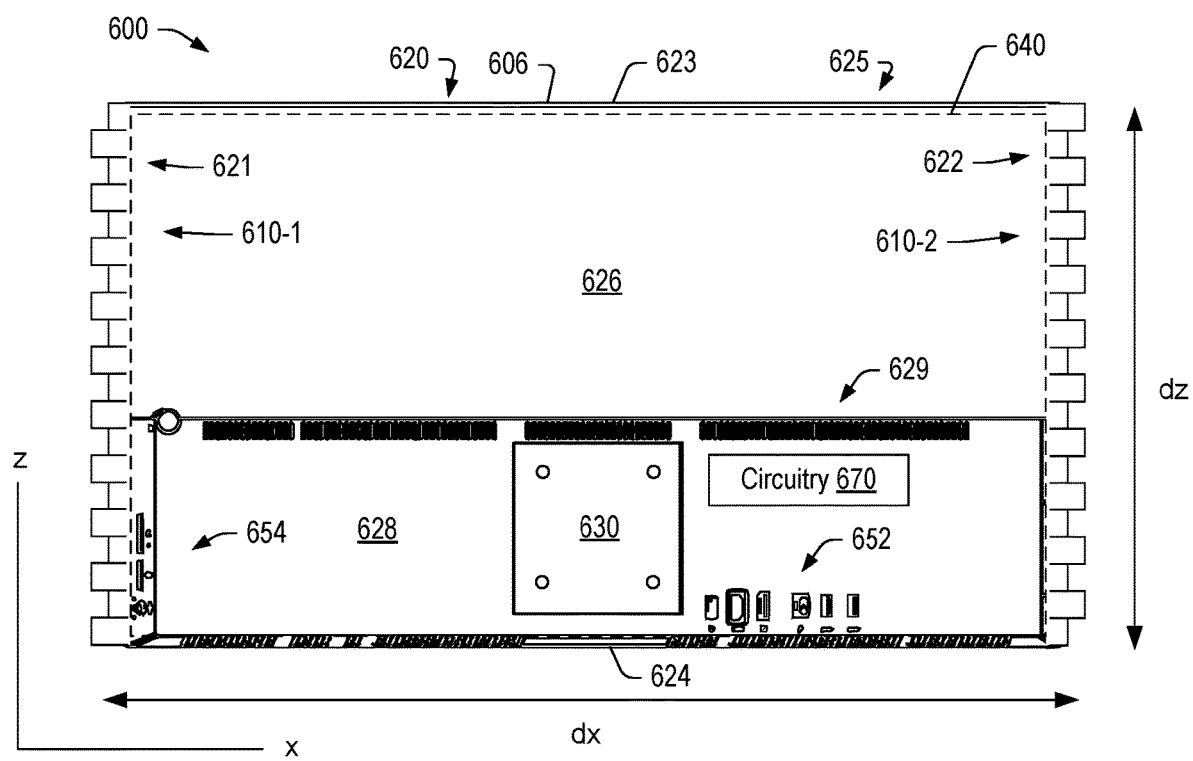
FIG. 4 is a back side view of an example of an interlocking display.

FIG. 4 shows an example of an interlocking display 600 that includes a rectangular display panel 640; and a housing 606 that includes a rectangular frame 620 that surrounds the rectangular display panel 640, where at least one short or side edge 621 and 622 of the rectangular frame 620 can include one or more sets of keys and keyways 610-1 and 610-2. As shown, the rectangular frame 620 can include the side edges 621 and 622 (e.g., short edges), a top edge 623 and a bottom edge 624 (e.g., long edges) where one or more of the sets of keys and keyways 610-1 and 610-2, as interlocking structures, are at one or more of the side edges 621 and 622, the top edge 623 and the bottom edge 624. In such an example, other equipment (e.g., one or more displays, one or more accessories, etc.) that includes a matching set of keys and keyways can be interlocked with the interlocking display 600 to help maintain a desired alignment. In such an example, some amount of movement can exist in one or more degrees of freedom (DoF) between interlocked equipment where, overall, the interlocking of keys and keyways reduces the number of degrees of freedom (DoF) between such interlocked equipment.

As an example, the rectangular frame 620 can include one or more of the sets of keys and keyways 610-1 and 610-2 as integral features and/or as features coupled thereto. For example, at least a portion of the rectangular frame 620 can be formed, machined, etc., as a unitary piece of material that includes one or more of the sets of keys and keyways 610-1 and 610-2. In such an example, an injection molding process may be utilized where an injection mold includes features to form one or more keys and keyways and/or a machining process may be utilized to cut into material to form one or more keys and/or keyways. Where a set of keys and keyways is formed as a separate piece, it may be attached to a display to make the display an interlocking display. For example, consider attachment via glue, connectors, magnets, ferromagnetic material, etc., which may provide for attachment and detachment of a set of keys and keyways. As an example, a set of keys and keyways can attach to a display using a magnetic attraction force where the set of keys and keyways and/or the display includes one or more magnets (e.g., permanent magnets). In such an example, one or more pieces of ferromagnetic material may be utilized that can be attracted to a magnet or magnets.

As shown, the interlocking display 600 can include a back side 626, a raised back side 628, vents 629, a mount 630, and connectors 652 and 654 where, for example, the connectors 652 are disposed on the raised back side 628 and the connectors 654 are disposed near the side edge 621.

In the example of FIG. 4, the interlocking display 600 can include dimensions dx of the top edge 623 and the bottom edge 624 and dz of the side edges 621 and 622 where dx is greater than dz. While the sets of keys and keyways 610-1 and 610-2 are shown on the side edges 621 and 622, one or more set of keys and keyways may be on the top edge 623 and/or the bottom edge 624. As to a thickness of the interlocking display 600 (e.g., in a direction along a y-axis), it may be relatively constant along the edges 621, 622, 623 and 624 and can increase with respect to the raised back side 628.

As an example, the housing 606 can be made of one or more materials. As an example, the housing 606 can include a bezel as an integral or separate piece or pieces that surround at least a portion of the rectangular display panel 640. As an example, the rectangular frame 620 can include a bezel or bezel portions. As an example, a user or users may view the rectangular display panel 640 from a display side 625 (e.g., a front side) of the interlocking display 600 where the rectangular frame 620 can surround the rectangular display panel 640.

As explained, a display can include a mount as a back side mount, which may be positioned in a central location, which may be centered along one or more dimensions. In the example of FIG. 4, the mount 630 is centered along the x dimension dx while being offset from a center of the z dimension dz.

As shown, the interlocking display 600 includes circuitry 670 that can be coupled to the connectors 652 and 654. For example, the circuitry 670 can include power circuitry, display circuitry operatively coupled to the rectangular display panel 640, audio circuitry, data circuitry, etc. For example, consider power circuitry that can regulate power from a power source (e.g., a wall outlet, a battery, etc.) for other circuitry of the interlocking display 600. As to display circuitry, such circuitry can include one or more types of light emitting circuits (e.g., LED, OLED, LCD, etc.) that can form at least a portion of the rectangular display panel 640. As to audio circuitry, consider one or more speakers that can generate sound waves responsive to audio signals. As to data circuitry, consider instructions to control circuitry, touch response signals from touch sensing circuitry, stylus response signals from stylus sensing circuitry (e.g., digitizer circuitry), etc.

As an example, the interlocking display 600 may include a touch-display panel (e.g., touch screen display) and/or a digitizer display panel that operates in conjunction with a passive and/or active stylus. As to applications involving touch, a finger and/or a stylus touch may apply force to the display side 625 of the interlocking display 600. In such an example, one or more of the sets of keys and keyways 610-1 and 610-2 may interlock with another interlocking display and/or other component(s) in a manner that may help to stabilize the interlocking display 600 when forcibly contacted by a finger and/or a stylus such that an alignment of the interlocking display 600 with respect to another component (e.g., another interlocking display, an accessory, etc.) can be maintained.

As an example, the interlocking display 600 may be supported by a stand that couples to the mount 630 and/or by one or more components that couple to one or more of the sets of keys and keyways 610-1 and 610-2. As an example, consider a stand that includes two arms that include matching sets of keys and keyways that can couple to the sets of keys and keyways 610-1 and 610-2 and/or a stand with a top edge that includes a set of keys and keyways that can couple to a set of keys and keyways at the bottom edge 624 of the interlocking display 600.

Figure 5:
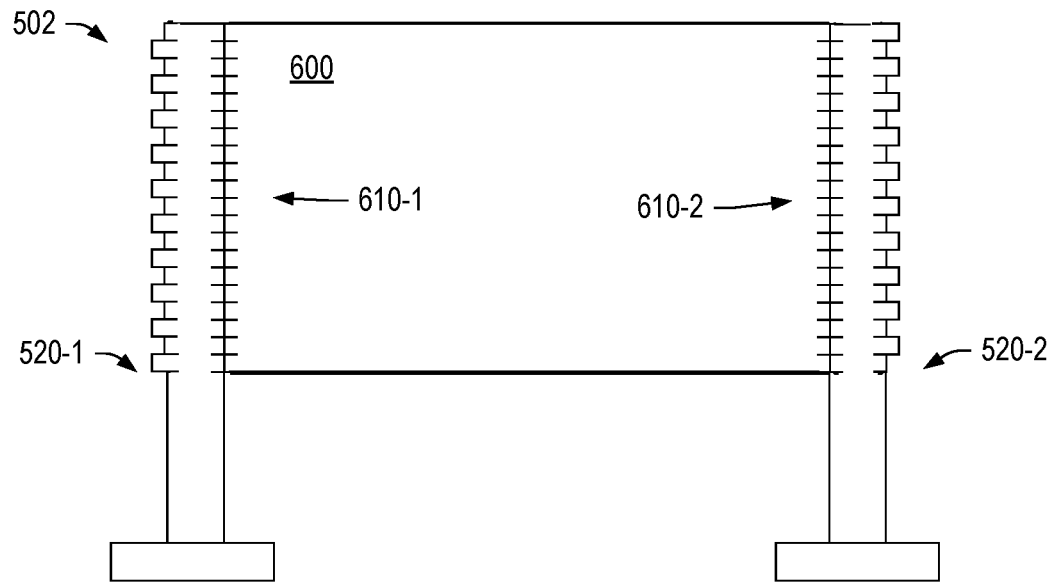
FIG. 5 is a series of views of examples of assemblies.
Figure 5:
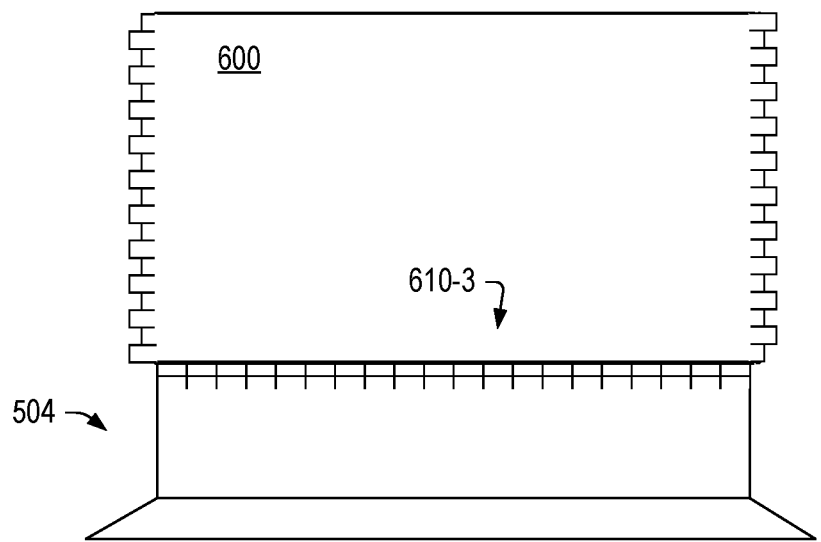

FIG. 5 shows examples of assemblies where the interlocking display 600 may be supported by a stand 502 or a stand 504 that couples to one or more of the sets of keys and keyways 610-1, 610-2 and 610-3. As shown, the stand 502 includes two arms 520-1 and 520-2 that include matching sets of keys and keyways that can couple to the sets of keys and keyways 610-1 and 610-2 and the stand 504 includes a top edge that includes a set of keys and keyways that can couple to the set of keys and keyways 610-3 at the bottom edge 624 of the interlocking display 600.

In the example of FIG. 5, the arms 520-1 and 520-2 can include sets of keys and keyways on one or more sides. For example, one of the arms 520-1 or 520-2 may be a stand for two interlocking displays were one interlocking display couples to one side of the stand and another interlocking display couples to another side of the stand such that the stand is in the middle between the two interlocking displays.

Figure 6:
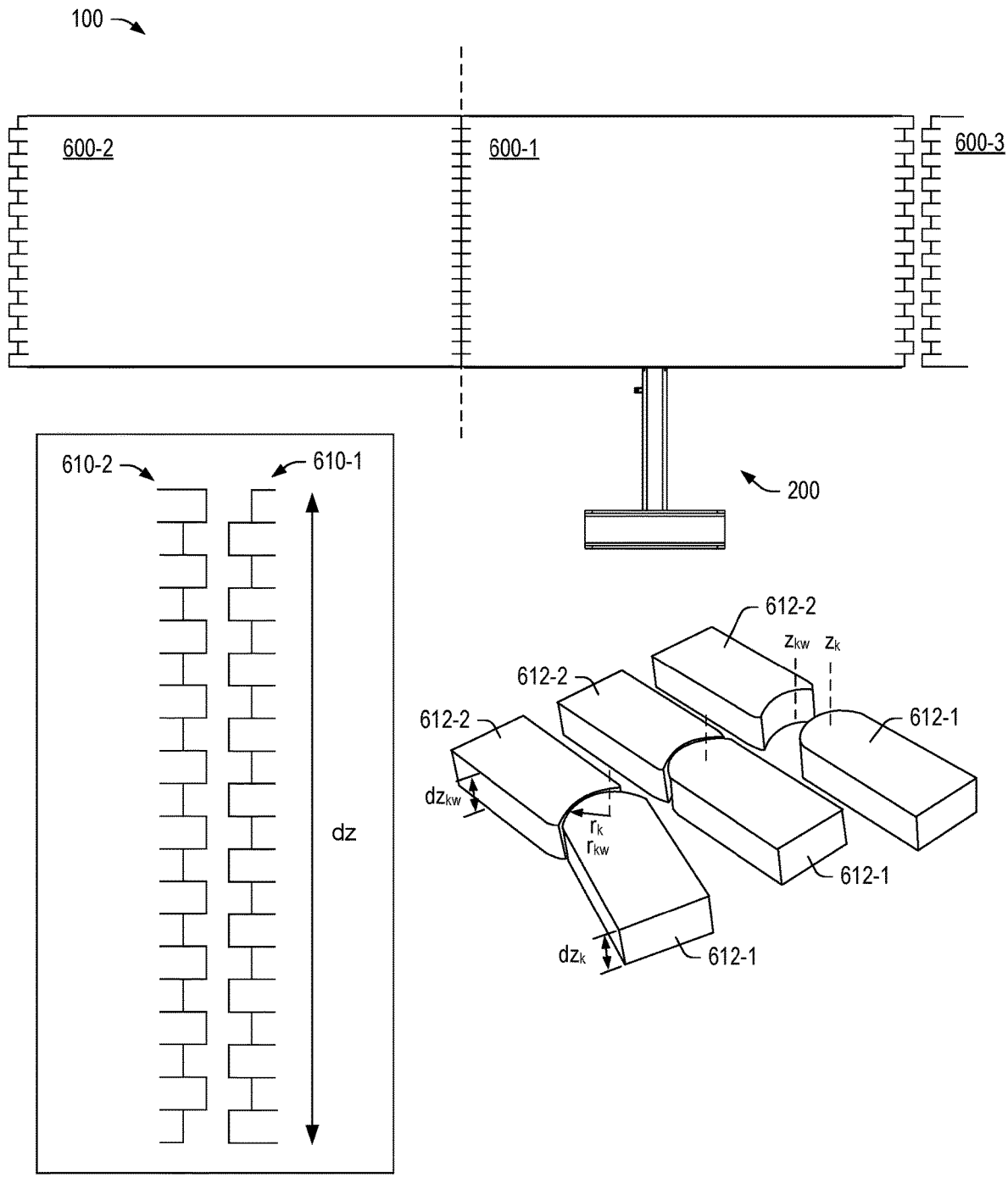
FIG. 6 is a series of views of examples of sets of keys and keyways of interlocking displays.

FIG. 6 shows an assembly that includes at least two of the interlocking displays 600-1, 600-2 and 600-3 with sets of keys and keyways 610-1 and 610-2. For example, the interlocking display 600-1 can be mounted to the stand 200 via a back side mount while the interlocking displays 600-2 and 600-3 can be coupled to the interlocking display 600-1 via the sets of keys and keyways 610-1 and 610-2.

In the example of FIG. 6, a key component 612-1 and a keyway component 612-2 are shown in various arrangements. As shown in the sets of keys and keyways 610-1 and 610-2, these components 612-1 and 612-2 may be alternated in a stack. As shown, the key component 612-1 can included a rounded end that is convex to form a key and the keyway component 612-2 can include a rounded end (e.g., a rounded seat) that is concave to form at least a portion of a keyway. These rounded ends can mate in a manner that allows for some pivoting with respect to one another, for example, about an axis. As shown, each rounded end can define an axis where, once mated, the axes can align. As an example, the key component 612-1 can form a planar extension and the keyway component 612-2 can form at least part of a planar slot. For example, a set of keys and keyways can include planar extensions (e.g., each with a rounded end) and can include planar slots (e.g., each with a rounded seat).

As shown in FIG. 6, various dimensions can define a key and a keyway. For example, the key component 612-1 is shown as being defined at least in part by a key thickness $dz_k$ and a key radius $r_k$ while the keyway component 612-2 is shown as being defined at least in part by a keyway thickness $dz_{kw}$ and a keyway radius $r_{kw}$ where the thicknesses $dz_k$ and $dz_{kw}$ can be approximately equal and the radii $r_k$ and $r_{kw}$ can be approximately equal. In the example of FIG. 6, the radii $r_k$ and $r_{kw}$ can be measured from axes $z_k$ and $z_{kw}$, which can be a common axis when the key component 612-1 and the keyway component 612-2 mate such that interlocking occurs. As illustrated in the example of FIG. 6, a common axis can be a rotational axis about which rotation of the key component 612-1 and the keyway component 612-2 can rotate with respect to each other. As an example, a thickness of an interlocking display at an edge or edges may be approximately equal to twice a key component radius (e.g., a key component diameter) or twice a keyway component radius (e.g., a keyway component diameter).

As an example, a stack of key components and keyway components can be alternated in the stack. As explained, key components and keyway components can define a pivot axis for pivotal movement of an interlocking display without translational movement of the interlocking display for interlocking contact between an edge of the interlocking display and an edge of another instance of the interlocking display and/or one or more accessories. As an example, a pivot axis can be a rotational axis for rotational movement (see, e.g., the angle β in FIG. 8, etc.).

As shown in the example of FIG. 6, an edge of an interlocking display can include a number of keys and keyways as a set. For example, consider a number of keys in a range from 2 to 100 and a number of keyways in a range from 2 to 100. As shown, each of the set of keys and keyways 610-2 and 610-1 includes 10 keys and 10 keyways. As an example, an edge may include the same number of keys as keyways or may include a different number of keys and keyways. As an example, where an interlocking display includes long edge and short edge keys and keyways, a number, size, shape, etc., may be the same or may differ between the long edge and the short edge.

As an example, a set of keys and keyways can be made of one or more materials such as, for example, a polymeric material that can be characterized by a hardness, a Young's modulus, etc. As an example, such a material can be rated with an amount of friction with respect to itself. As an example, a set of keys and keyways can be stacked in a manner that provide for an interference fit with another set of keys and keyways. In such an example, an interference fit may help to physically stabilize interlocking between sets of keys and keyways.

As an example, a set of keys and keyways can include one or more magnets that can provide at least a magnetic attraction force with respect to another set of keys and keyways, which may include magnets and/or ferromagnetic material. For example, consider components as including magnets with magnetic polarity where mating components can include magnets of opposite magnetic polarity.

As an example, a set of keys and keyways can include translucent and/or transparent material that may be suitable to operate as a light guide. For example, consider one or more LEDs as emitting light that can be carried by a set of keys and keyways where, for example, the brightness, color, etc., of the one or more LEDs can be controllable. In such an example, an interlocking display may provide for aesthetic and/or utilitarian lighting. As to aesthetic lighting, consider lighting controlled with respect to a game application, music, etc. As to utilitarian lighting, consider lighting that can help to illuminate a workspace for one or more purposes.

Figure 7:
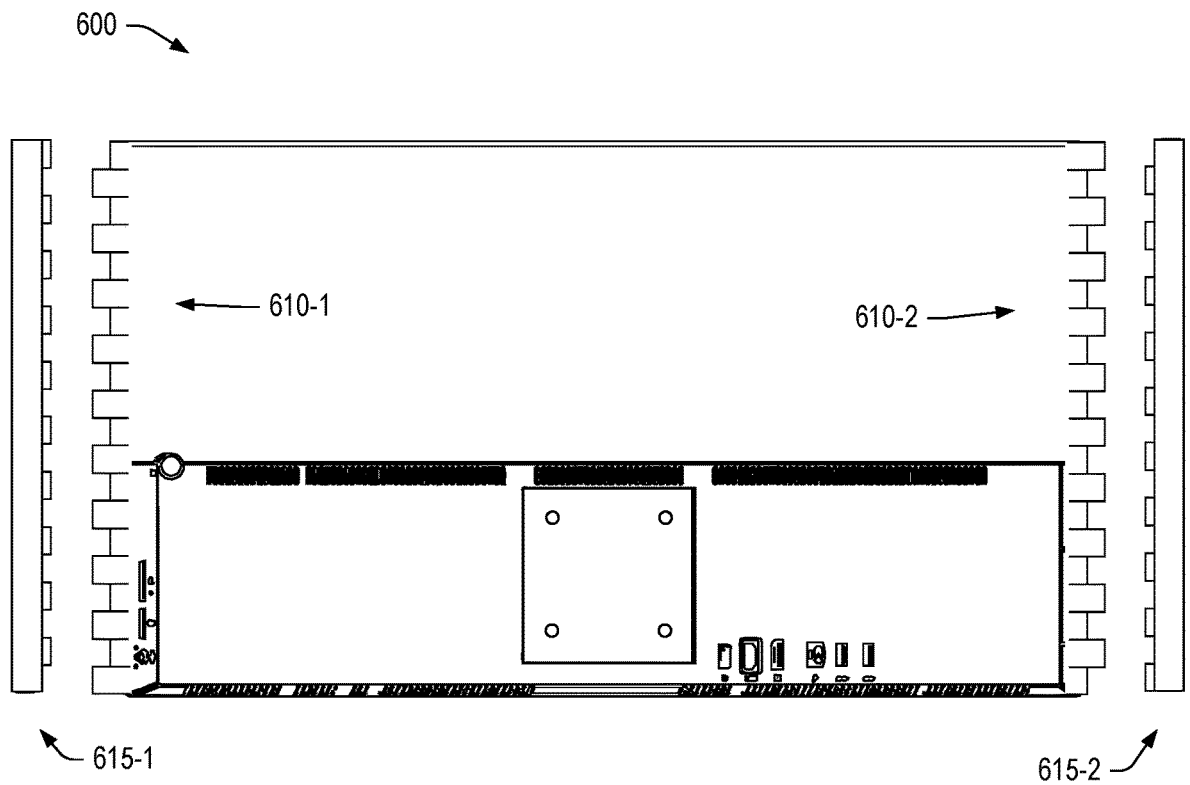
FIG. 7 is a back side view of an example of an interlocking display with at least one keys and keyways cover.

FIG. 7 shows the interlocking display 600 as in FIG. 4 along with one or more covers 615-1 and 615-2 for the one or more sets of keys and keyways 610-1 and 610-2. In such an example, one or more sets of keys and keyways can be hidden, for example, to provide a smooth edge or smooth edges for the interlocking display 600. In such an approach, a cover may or may not include an equivalent number of keys and keyways. For example, a cover may include fewer features than one of the sets of keys and keyways 610-1 and 610-2 as the function of a cover may be to protect (e.g., from dust, contact, etc.) rather than for alignment of the interlocking display 600 with another component (e.g., a stand, another interlocking display, etc.). As an example, where a user desired to use a set of keys and keyways for interlocking, the user may remove a cover and store the cover, as may be desired. As an example, a cover or covers may be utilized for handling, shipping, etc., such that a set or sets of keys and keyways are not damaged. As an example, a cover may be translucent, transparent and/or opaque. As an example, a cover may include one or more magnets and/or ferromagnetic material, which may provide a magnetic attraction force with a set of keys and keyways (e.g., to secure the cover to the set of keys and keyways).

Figure 8:
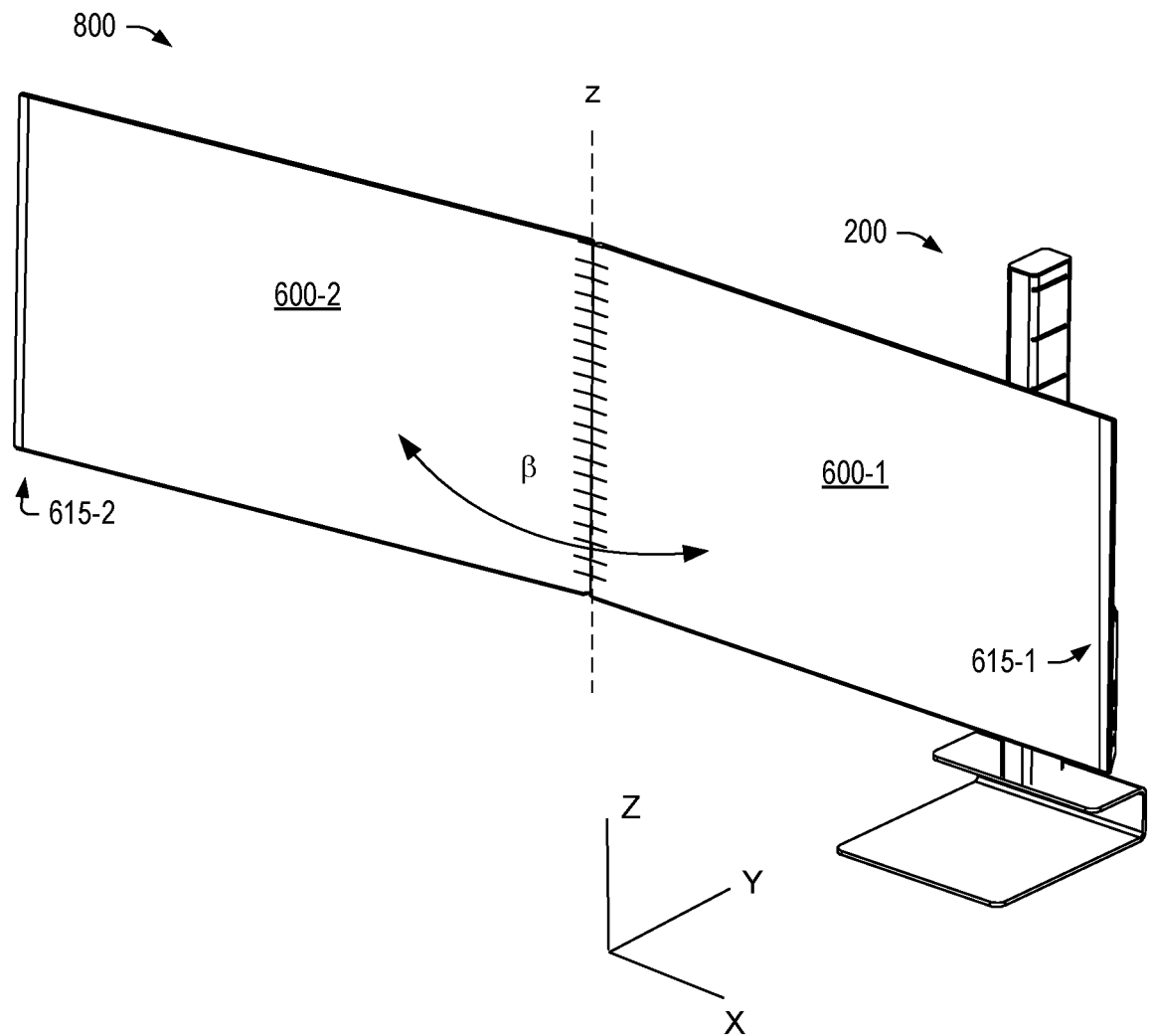
FIG. 8 is a perspective view of an example of an assembly.

FIG. 8 shows an example of an assembly 800 that includes two interlocking displays 600-1 and 600-2 where the interlocking display 600-1 is mounted to the stand 200. In the example of FIG. 8, the interlocking displays 600-1 and 600-2 can be aligned corresponding edges in a manner that can allow for some amount of freedom such as rotational freedom along an axis z defined by the mating interlocking sets of keys and keyways. In such an example, a user may rotate the interlocking display 600-2 inward such that an angle β is less than 180 degrees with respect to the interlocking display 600-1. As an example, the angle may be adjustable in a range that can include 180 degrees and at least some angles less than 180 degrees. For example, consider a range that includes approximately 90 degrees and approximately 180 degrees. In the example of FIG. 8, the interlocking display 600-1 may include a cover 615-1 and the interlocking display 600-2 may include a cover 615-2 such that edges of the assembly 800 are relatively smooth.

As an example, utilization of interlocking features for multiple displays can help to address one or more of the issues described with respect to FIG. 1. For example, an approach as in FIG. 8 can help to prevent misalignments as shown in FIG. 1 (lower scenario where originally aligned parallel side edges become misaligned and other than parallel).

Figure 9:
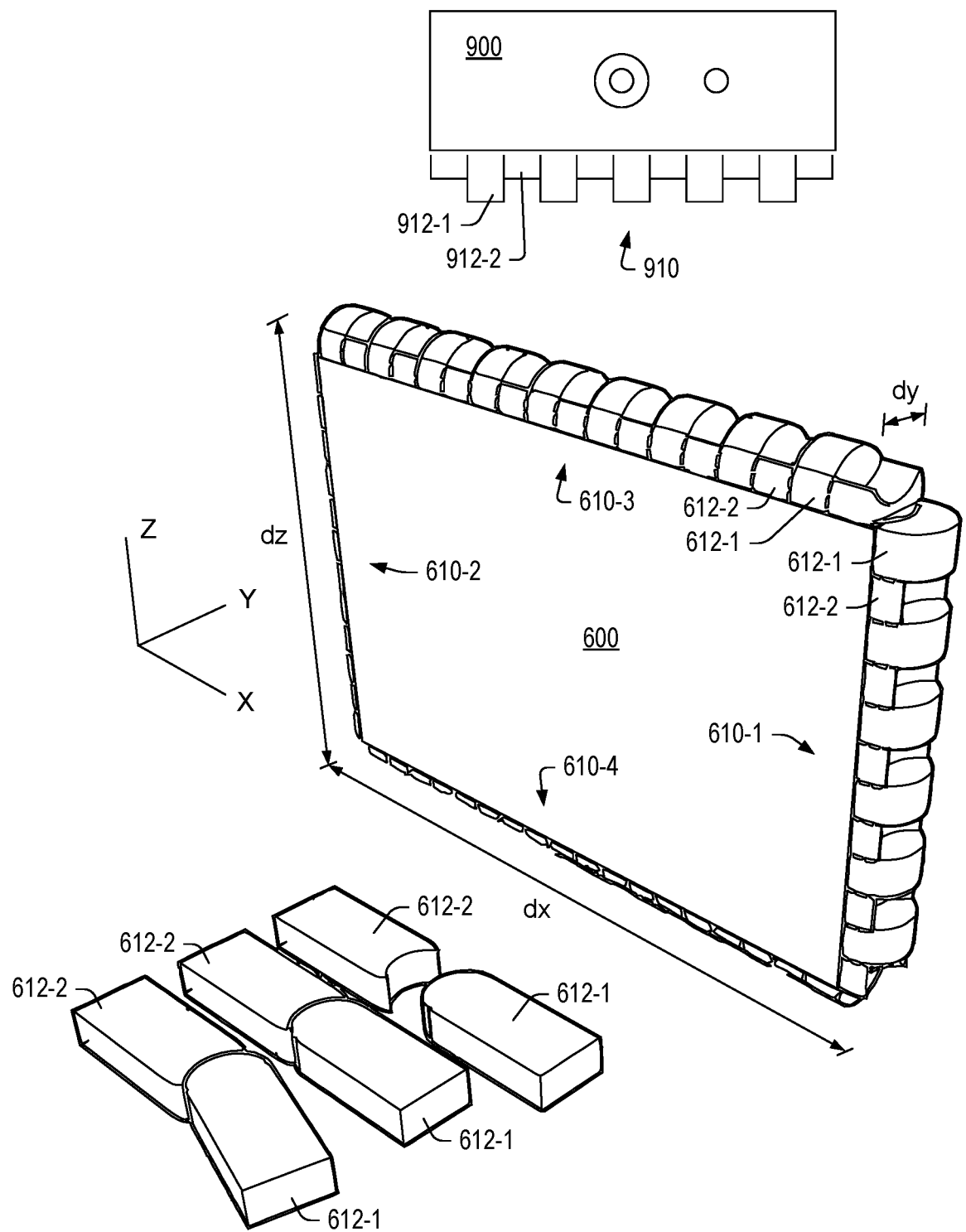
FIG. 9 is a series of views of an example of an interlocking display and an example of an accessory device.

FIG. 9 shows an example of the interlocking display 600 that includes sets of keys and keyways 610-1, 610-2, 610-3 and 610-4 on each of its edges. FIG. 9 also shows an example of an accessory 900 that includes a set of keys and keyways 910 that can interlock with one or more of the sets of keys and keyways 610-1, 610-2, 610-3 and 610-4. As explained, interlocking can limit one or more degrees of freedom of movement between one component and another while allowing for some movement. For example, consider the accessory 900 as be pivotable with respect to an edge of the interlocking display 600. As an example, the accessory 900 can include one or more features that provide for movement. For example, consider the set of keys and keyways 910 as being part of a base of the accessory 900 where a joint (e.g., ball joint, etc.) can allow for movement of another part of the accessory 900 with respect to the base. As shown, the set of keys and keyways 910 can include key components 912-1 and keyway components 912-2.

In the example of FIG. 9, the accessory 900 may include various types of circuitry. For example, consider camera circuitry, microphone circuitry, lighting circuitry, speaker circuitry, etc. As an example, one or more accessories can be coupled to an interlocking display. For example, consider left and right speakers, a lower base speaker, etc. As an example, an accessory may be a holder for one or more devices. For example, consider a mobile phone holder where a user can place a mobile phone in a manner whereby a display of the mobile phone may be visible to the user along with one or more interlocking display screens.

In the example of FIG. 9, the interlocking display 600 is shown with respect to a Cartesian coordinate system X, Y and Z that can be utilized to define dimensions of the interlocking display 600 such as a thickness dy, a width dx and a height dz. As mentioned, a thickness of an interlocking display may be approximately equal to twice a key component radius or approximately equal to twice a keyway component radius (see, e.g., FIG. 6).

Figure 10:
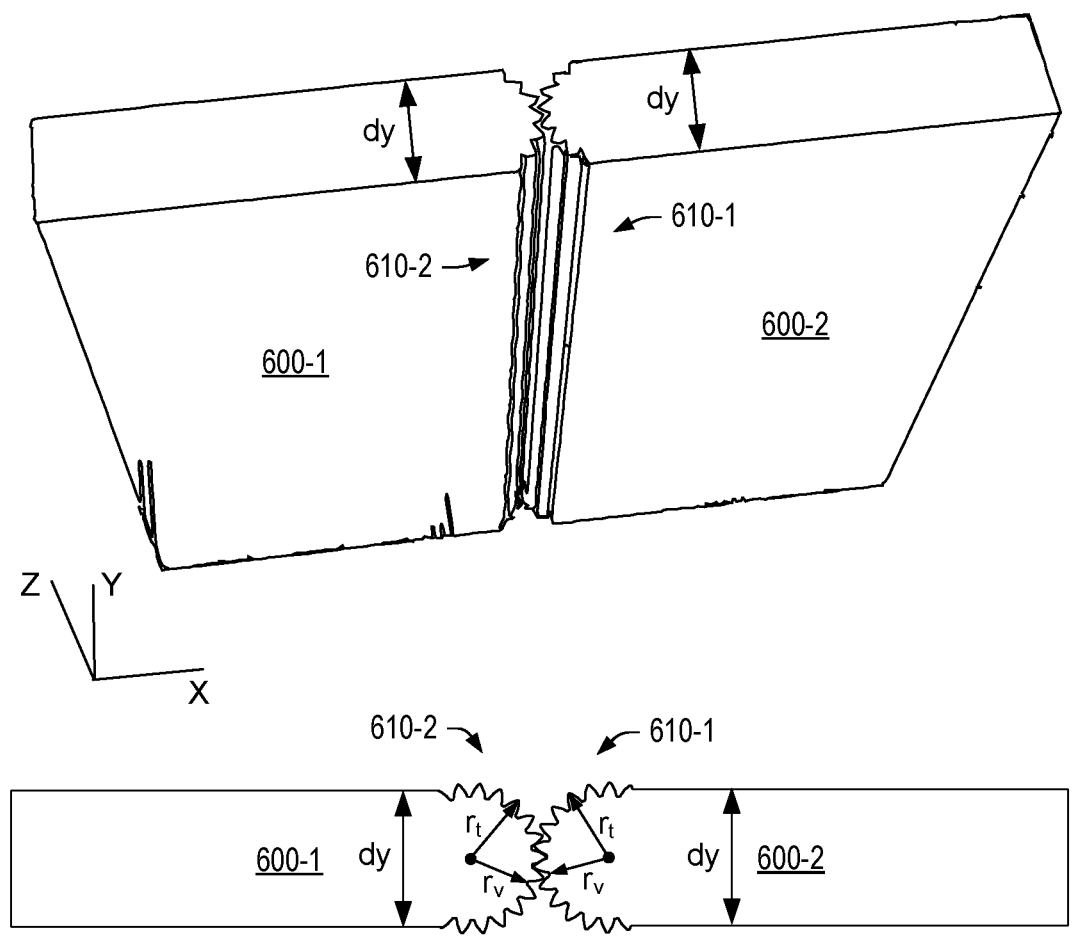
FIG. 10 is a series of views of an example of interlocking keys and keyways.

FIG. 10 shows an example of interlocking displays 600-1 and 600-2 that include sets of keys and keyways 610-1 and 610-2. As shown, the sets of keys and keyways 610-1 and 610-2 can be grooved with teeth forming peaks and valleys between the teeth. In the example of FIG. 10, the interlocking displays 600-1 and 600-2 can be rotatable with respect to each other via meshed interlocking of the sets of keys and keyways 610-1 and 610-2.

In the example of FIG. 10, the interlocking display 600-1 is shown having an edge that includes the set of keys and keyways 610-2 with keys and keyways as teeth forming peaks at a radius $r_t$ and valleys between the teeth at a lesser radius $r_v$. In such an example, a number of teeth may range from approximately three to more than 20 where an angular span of the teeth may be in a range from approximately 270 degrees to approximately 90 degrees; noting that a greater angular span may provide for greater amount of movement. In FIG. 10, the interlocking display 600-1 can be defined by an edge thickness dy that is approximately twice the teeth radius $r_t$ (e.g., dy is +/−10 percent of twice the teeth radius $r_t$). As shown, the interlocking display 600-2 can include matching features that can mate with the features of the interlocking display 600-1. As shown in the example of FIG. 10, the interlocking displays 600-1 and 600-2 can be movable along a z-axis direction of a Cartesian coordinate system X, Y and Z. For example, the teeth and valleys can be longitudinal, extending along a Z-axis direction. In such an approach, rotation can occur for the interlocking displays 600-1 and 600-2 with respect to each other via meshed engagement of opposing teeth and valleys.

Figure 11:
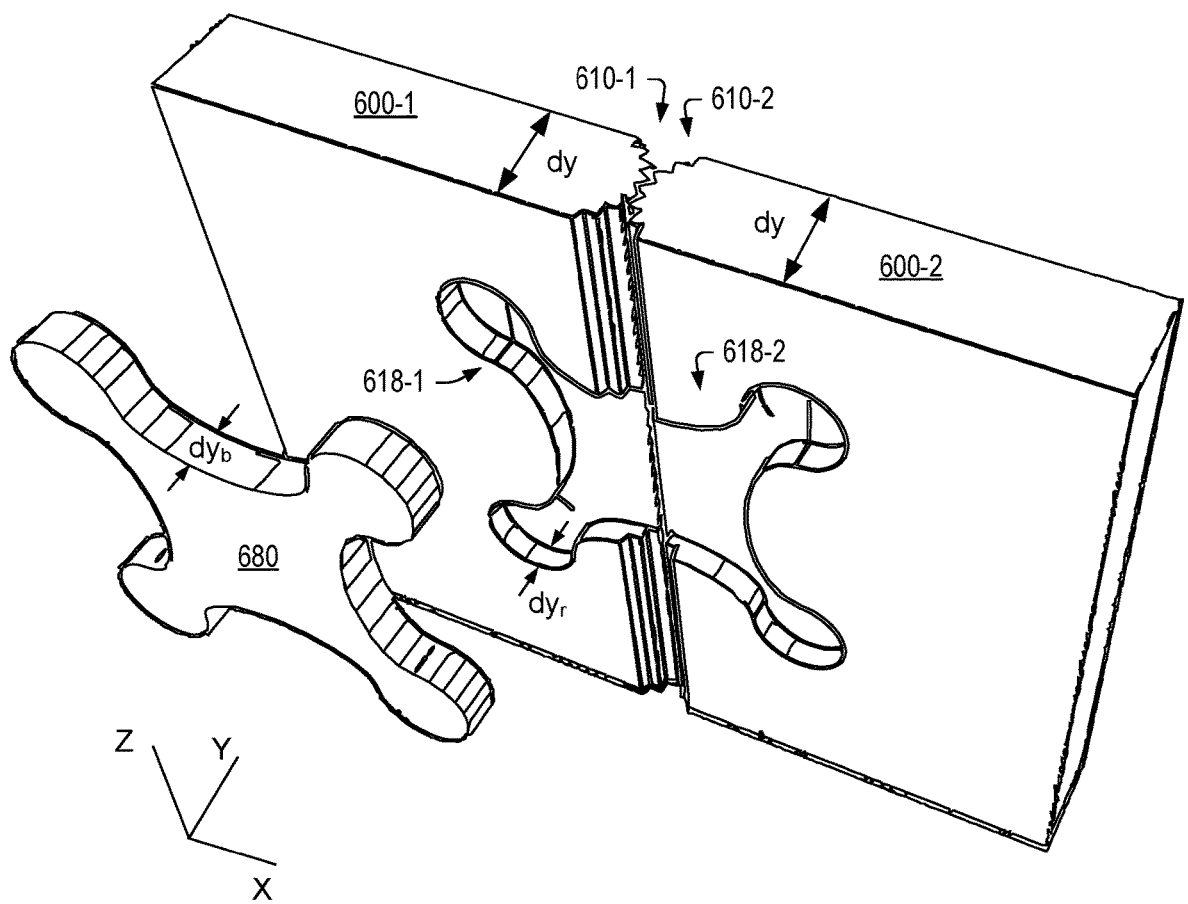
FIG. 11 is a perspective view of an example of interlocking components and an example of a bridge.

FIG. 11 shows an example of a back side of the interlocking displays 600-1 and 600-2 where a back surface of the interlocking display 600-1 includes a recess 618-1 and a back surface of the interlocking display 600-2 includes a recess 618-2. As shown, a bridge 680 can be shaped for insertion, at least in part, into both of the recesses 618-1 and 618-2 to bridge the interlocking displays 600-1 and 600-2 with the sets of keys and keyways 610-1 and 610-2 mated. In such an example, the bridge 680 can include lobes or other shapes that match corresponding shapes of the recesses 618-1 and 618-2. As an example, the bridge 680 can include a polymer or mixture of polymers that provide elastomeric properties. As an example, the bridge 680 may be interference fit (e.g., press-fit) into the recesses 618-1 and 618-2 such that it does not fall out in an undesirable manner. As an example, the bridge 680 may flexible to allow for some amount of rotation of the interlocking displays 600-1 and 600-2 with respect to each other. As an example, the bridge 680 may be rigid such that rotation of the interlocking displays 600-1 and 600-2 with respect to each other is limited (e.g., prevented).

As shown in the example of FIG. 11, the recesses 618-1 and 618-2 can be defined by a depth dy, and the bridge 680 can be defined by a thickness $dy_b$, which may be approximately equal to the depth of the recesses 618-1 and 618-2. As shown, the depth of the recesses 618-1 and 618-2 is less than a thickness dy of the interlocking displays 600-1 and 600-2. As shown, each of the recesses 618-1 and 618-2 can extend to an edge of its respective interlocking display 600-1 and 600-2.

As to the shape of the bridge 680 in the example of FIG. 11, it may be defined as a modified dogbone or a modified dumbbell shape. A dogbone can be defined as including a central shaft and two lobes at each end of the central shaft and a dumbbell shape can be defined as including a central shaft and one lobe at each end of the central shaft. In the example of FIG. 11, the bridge 680 can be symmetric such that it can be inserted into the recesses 618-1 and 618-2 at various angles and optionally front side in or back side in.

Figure 12:
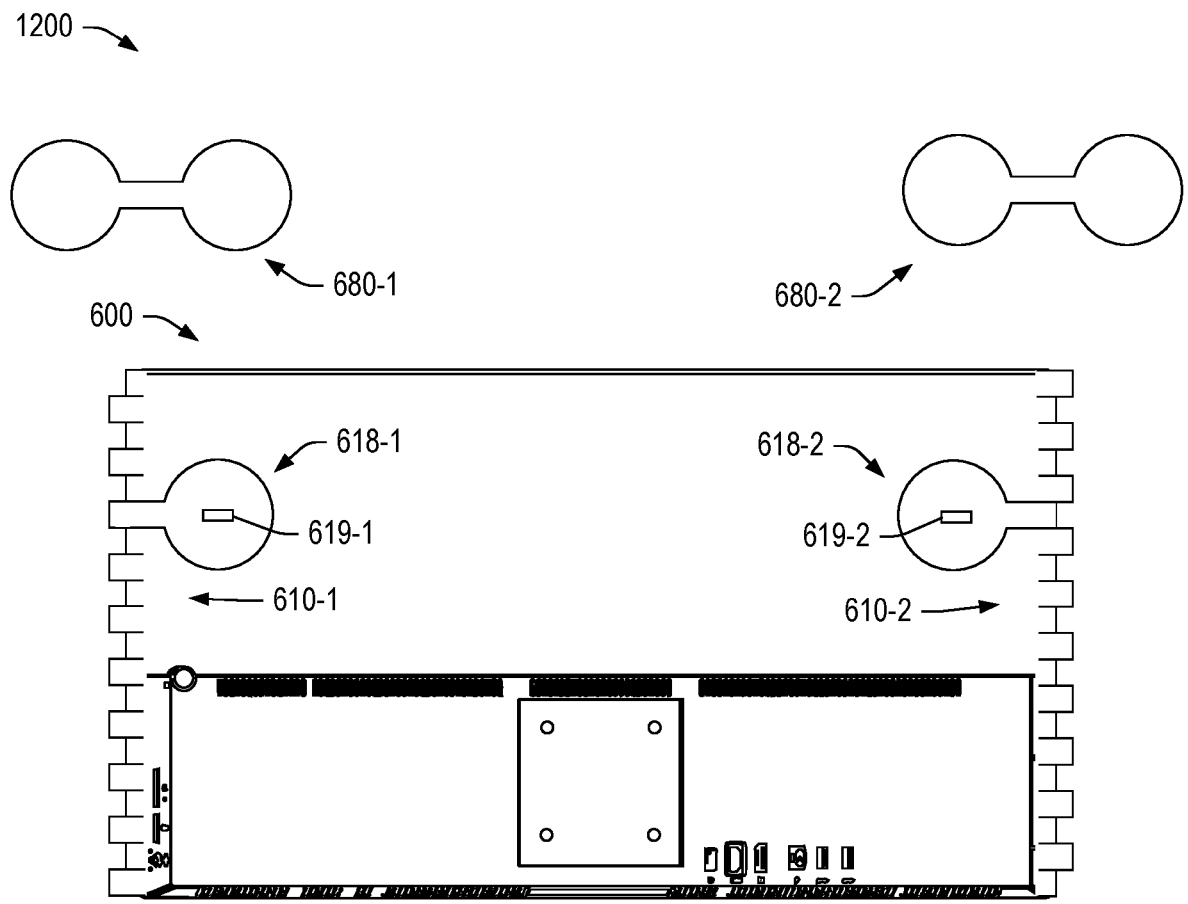
FIG. 12 is a series of views of an example of an interlocking display and examples of bridges.
Figure 12:
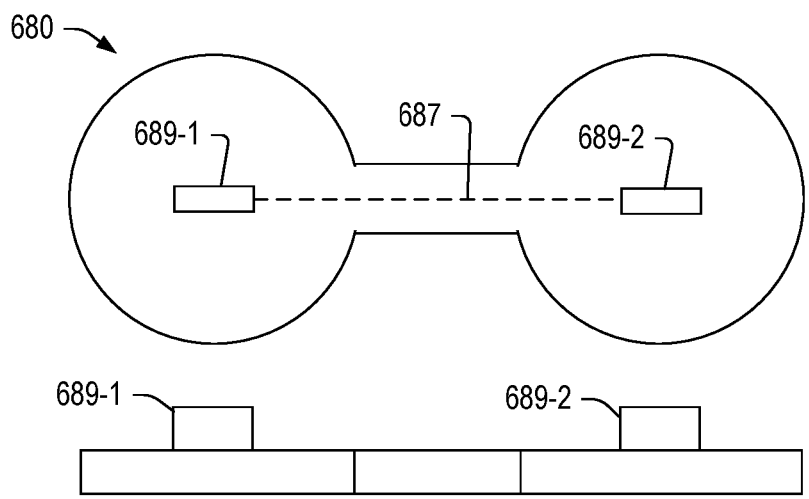

FIG. 12 shows an example of an assembly 1200 that includes an example of the interlocking display 600 and examples of the bridges 680, 680-1 and 680-2. As shown, the interlocking display 600 can include back surface recesses 618-1 and 618-2 where each of the recesses 618-1 and 618-2 can include a connector 619-1 and 619-2. As shown, each instance of the bridge 680 can include connectors 689-1 and 689-2 the connectors 689-1 and 689-2 are connected via circuitry 687, which may be a wire or wires or, for example, an optical fiber or optical fibers. In such an example, one interlocking display can be bridged to another interlocking display or a component (e.g., stand, accessory, etc.) that includes a mating connector.

In the example of FIG. 12, the bridges 680, 680-1 and 680-2 can be defined as a modified dogbone shape or a dumbbell shape. As shown, the lobes may be defined using a radius, a diameter, etc. For example, a lobe can be circular in shape or in part circular in shape. In the example of FIG. 12, the bridges 680, 680-1 and 680-2 can include some amount of symmetry, whether with or without the connectors 689-1 and 689-2. As an example, the connectors 689-1 and 689-2 can be orientation agnostic connectors such as, for example, a USB-C type of connector. In such an approach, a bridge can be inserted when at 0 degrees (e.g., horizontal) or when rotated by 180 degrees (e.g., horizontal) where connections may be made. As an example, where the connectors 689-1 and 689-2 are not to be used, the bridge 680 may be flipped and inserted such that the connectors 689-1 and 689-2 face outwardly rather than inwardly.

In the example of FIG. 12, the interlocking display 600 is shown with particular sets of keys and keyways 610-1 and 610-2, which may be shaped as shown in FIG. 9 and/or FIG. 10 and/or in one or more other manners.

As an example, an accessory may include a recess such that an accessory can be bridged to an interlocking display via a bridge. For example, consider the accessory 900 of FIG. 9 as including a recess, which may or may not include a connector. As an example, a recess of an interlocking display may extend to a top edge, a bottom edge and/or a side edge. For example, a recess may provide for bridging to a side and to a top or to a side and to a bottom, optionally with features for electrical connection.

As an example, a bridge can provide for transmission of power and/or data without utilization of a separate cable. For example, rather than stringing multiple cables to multiple interlocking displays, a bridge or bridges may be utilized where such a bridge or bridges includes connectors.

As an example, a bridge can include serial transmission connectors for transmission of at least one of data and power. As an example, such connectors may be universal serial bus ports (e.g., USB ports), which may comport with one or more USB standards (e.g., USB Type A, USB Type B, USB Type C, etc.). An interlocking display and/or an accessory may include a hub such as a USB hub.

As to USB specifications, USB 3.0 is known as SuperSpeed (SS) with data rates of 5 Gbps (e.g., consider USB 3.1 Gen 1, Gen 2, etc., which can provide data rates in excess of 5 Gbps). As to power, SuperSpeed devices may be rated at 0.75 W (low-power) and 4.5 W (high-power). USB can be used to charge batteries, by delivering up to 25 W from a charger, a host device with a dedicated charging port (DCP) or a charging downstream port (CDP), the latter of which also provides a data signal. The 2012 specification for USB Power Delivery (PD) provides compatible downstream devices to request greater supply voltage and current from compatible host equipment (e.g., up to 10 W at 5 V, increasing to 36 W/60 W at 12 V and 60 W/100 W at 24 V). USB can utilize both active and passive cables.

USB Type C includes 24 contacts or wires and can be plugged in either of two different orientations. USB Type C includes various operating modes (e.g., Alternate Mode, Accessory Mode, etc.). As to power, as mentioned, SuperSpeed had a maximum of 4.5 W. In contrast, Type C can provide 15 W over a VBUS connection (e.g., via currents of 1.5 A and 3 A at 5 V). USB Type C supports the Power Delivery 2.0 specification. As an example, power can be transmitted to power an interlocking display, interlocking displays, an accessory, accessories, etc.

As an example, a connector may be suitable for carrying USB 3.X and DisplayPort (DP) signals, as well as power. As an example, a PERICOM/Diodes Incorporated PI3USB31532 Type C crossbar switch chip, a PERICOM/Diodes Incorporated PI3EQX1002B ReDriver chip and a USB 3.X hub can be utilized. As an example, one or more types of display connectors, display connection technologies, etc., may be utilized (e.g., HDMI, DP, etc.).

As explained, various joints of arms of a stand can allow for movement of the arms such that one or more devices may be appropriately positioned where, for example, there may be different classes of devices. For example, consider a heavy weight class and a light weight class where the heavy weight class is for devices with a mass greater than approximately 0.5 kg (e.g., greater than approximately 1 lb). As an example, classes may be dependent on mounting type. For example, planar devices such as displays may be suitable for mounting using a plate type of mount (e.g., VESA, etc.); whereas, some media capture types of devices and/or associated devices (e.g., lighting, etc.) may be suitable for mounting using a socket type of mount (e.g., a "tripod" type of mount, whether male and/or female).

As explained, an interlocking display can include features that provide for coupling, mounting, etc., a stand, one or more additional interlocking displays and/or one or more accessories. In various examples, a stand may suffice with a single arm. For example, consider mounting an interlocking display to a single arm of a stand and then mounting one or more additional components to the interlocking display via one or more sets of keys and keyways.

As an example, an accessory device may be a device other than a microphone, a camera or an illumination device. For example, consider a smartphone holder, a speaker (e.g., wired and/or wireless), a watch holder, a wireless charging station, a memory card device, a biometric reader (e.g., fingerprint, eye, etc.), an electronic sketch pad, a touchpad, a digitizer tablet, a divider/privacy panel, a voice recorder, a rechargeable battery, one or more solar cells, a port, etc.

Figure 13:
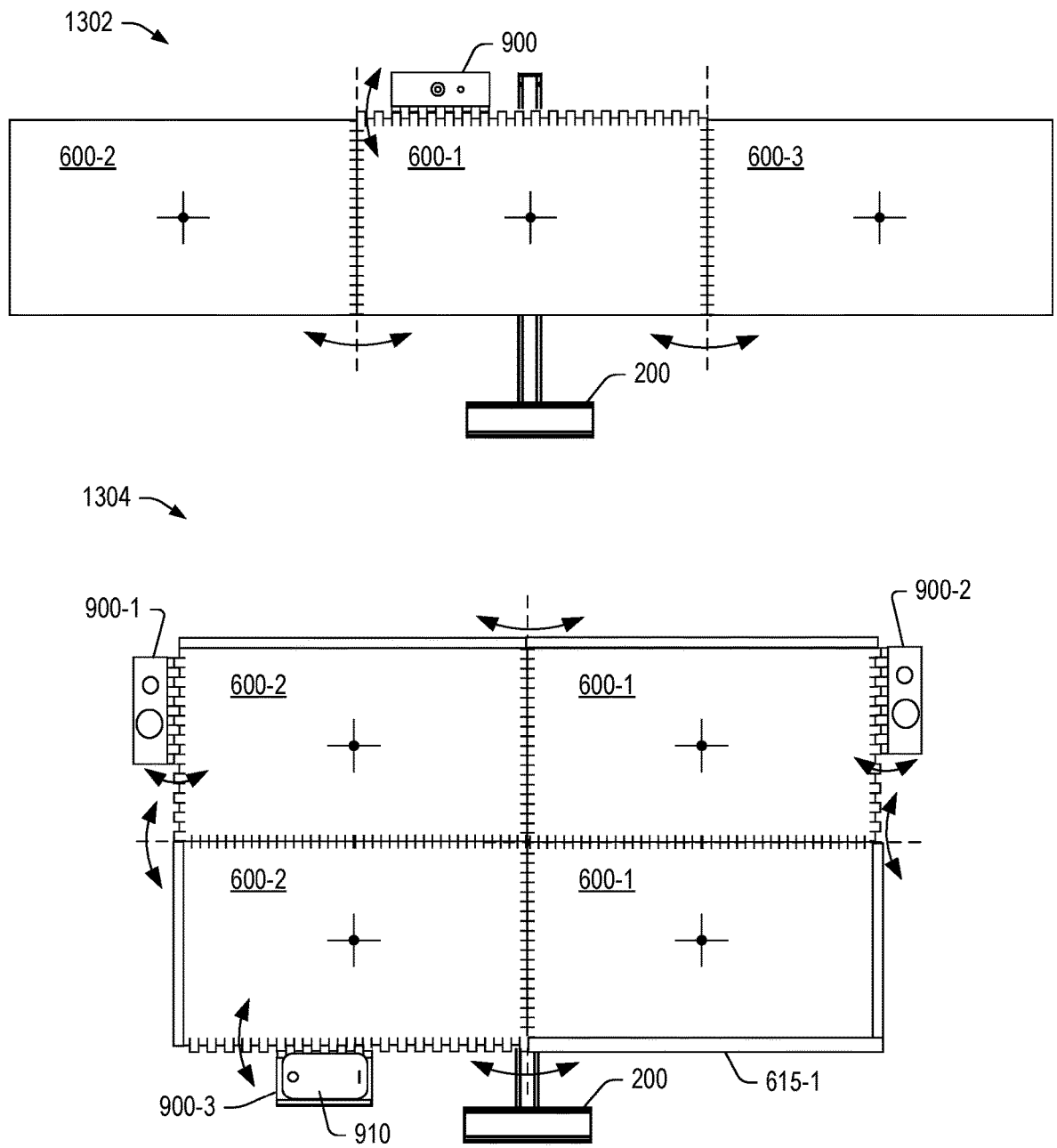
FIG. 13 is a series of views of examples of assemblies that include interlocking displays.

FIG. 13 shows examples of assemblies 1302 and 1304 that include two or more interlocking displays 600-1, 600-2, 600-3 and 600-4 and one or more accessory devices 900, 900-1, 900-2 and 900-3.

As shown, the assembly 1302 includes three interlocking displays 600-1, 600-2 and 600-3 supported by a stand 200 where the interlocking displays 600-2 and 600-3 can pivot at the edges of the interlocking display 600-1. For example, consider an inward pivot such that the interlocking displays 600-2 and 600-3 provide for a surround experience. As an example, a pivot angle may be in a range from greater than 0 degrees to approximately 90 degrees. As shown, the accessory device 900 may be mounted to the interlocking display 600-1 at an edge where interlocking keys and keyways provide for pivoting of the accessory device 900, which may be, for example, a camera or cameras, optionally with one or more microphones, face lights, flashes, etc.

As shown, the assembly 1304 includes four interlocking displays 600-1, 600-2, 600-3 and 600-4 that form a two-by-two grid, noting that various grids may be formed (e.g., two-by-three, three-by-three, etc.). As shown in FIG. 13, the assembly 1304 can include the accessory devices 900-1 and 900-2 as, for example, left and right speakers that may be pivoted as desired by a user to improve an audio experience. In the example of FIG. 13, the assembly 1304 also includes the accessory device 900-3, which is a holder and/or charger for a cellular phone 910; noting that a holder may be provided for one or more other devices (e.g., a stylus, a mouse, ear buds, a headset, etc.). In such an example, the accessory device 900-3 may be pivoted to provide a suitable viewing angle for a user such that the user can see content rendered to the interlocking displays 600-1, 600-2, 600-3 and 600-4 and content rendered to a display of the cellular phone 910.

As an example, an accessory device may be another interlocking display that may be smaller in area than the interlocking displays 600-1, 600-2, 600-3 and 600-4. For example, consider a tablet sized interlocking display that can include a set of keys and keyways that can be interlocked with another set of keys and keyways. For example, consider a tablet of the size of the accessory device 900-3 that can be coupled to an interlocking display and pivoted to a desired viewing angle about an axis defined by interlocking keys and keyways.

As explained, multi-monitor configurations even when using the same monitor models can be difficult to align perfectly. As explained, various stands, mounts, etc., provide for horizontal, vertical, tilt, and rotational controls; however, they can lack an ability to guarantee alignment and eliminate drift, for example, due to bumps and vibrations to a surface that supports a stand (e.g., a desktop, a table top, a wall, etc.).

Approaches that utilize double sided tape can be problematic as adhesive may age, stick to a display, etc. Further, a double sided tape approach can be fixed and not amenable to adjustment without replacing the double sided tape. As to single sided tape, it may be applied to back surfaces but can fail to prevent drooping, etc.

As explained, sets of keys and keyways can interlock in a manner that helps to maintain alignment, which may be perfect alignment. Such an approach can be suitable for horizontal and/or vertical alignment. As an example, a bridge and bridge recesses may be utilized where the bridge and the bridge recesses may include connectors. In various examples, a bridge can provide for mechanical coupling and may provide for electrical coupling. As explained, a bridge or bridges can be utilized in combination with sets of keys and keyways to reduce risk of misalignment, drooping, etc., optionally while retaining an ability to pivot components with respect to one another. For example, keys and keyways can include teeth, peaks, valleys, protrusions, sockets, etc. Interlocking of keys and keyways can provide for alignment along one or more dimensions of devices in a Cartesian coordinate space, etc. Interlocking can involve some amount of force such as a press-fit force to assure sets of keys and keyways remain engaged and/or can involve utilization of one or more bridges that can provide force sufficient to maintain physical contact between sets of keys and keyways.

As explained, pivoting may allow for adjustments while alignment along at least one dimension is maintained. For example, consider the assembly 1304 of FIG. 13 where various manners of pivoting exist while horizontal and/or vertical alignment can be maintained. In such an approach, a user may adjust an angle of an interlocking display, an accessory device, etc., while sets of keys and keyways remain engaged (e.g., mated).

As an example, a display can include a rectangular display panel; and a housing that includes a rectangular frame that surrounds the display panel, where a short edge of the rectangular frame includes keys and keyways, which can be a set of keys and keyways. As an example, keys and keyways can be arranged as a stack of planar extensions and planar slots. For example, consider each of the planar extensions as including a rounded end and each of the planar slots as including a rounded seat (see, e.g., the example key and keyway components 612-1 and 612-2 of FIG. 6).

As an example, a stack of keys and keyways can define a pivot axis for pivotal movement of a display without translational movement of the display for interlocking contact between a short edge of the display and a short edge of another display. For example, consider a pivot axis, which may be a rotational axis, whereby two planar displays can be oriented with respect to each other over a range of angles that can include an angle of approximately 180 degrees and angles less than 180 degrees (e.g., consider a range from approximately 90 degrees to approximately 180 degrees or more).

As an example, a display can include keys and keyways that include longitudinal teeth and longitudinal valleys where, for example, peaks of the longitudinal teeth define an outer radius of an edge of the display, which may be a short edge.

As an example, a display can include one or more covers that can cover keys and keyways. For example, consider a display that includes keys and keyway over at least a portion of a short edge of the display where a cover can cover the keys and keyways and may cover the entire short edge. In such an example, the cover may be referred to as a short edge cover (see, e.g., the example covers 615-1 and 615-2 in FIG. 7). In such an example, the short edge cover can interlock with at least one of the keys, with at least one of the keyways or with at least one of the keys and at least one of the keyways. As an example, a short edge cover can include an elastomer. For example, consider an elastomeric material that can deform elastically to couple to keys and/or keyways and/or to a portion of a display (e.g., a bezel portion, etc.). While a short edge is mentioned, a display can include one or more covers, which can include one or more long edge covers and/or one or more short edge covers.

As an example, a display can include a housing that includes a back surface and a bridge recess in the back surface of the housing. In such an example, the bridge recess may include an electrical connector. As an example, a display can include a bridge, where a portion of the bridge is receivable in a bridge recess. As an example, such a bridge may include at least two electrical connectors. For example, consider interlocking displays that include bridge recesses in their back surfaces where a bridge can be positioned in part in each of the bridge recesses where the bridge may or may not include electrical connectors that can couple to electrical connectors of the interlocking display such that circuitry of the interlocking display may be electronically coupled. In such an example, circuitry can include display circuitry such that display signals can be received by a bridged interlocking display from another bridged interlocking display for purposes of rendering content to a display panel. As to some examples of connectors, consider HDMI, DP, etc.

As an example, a display can include an accessory that includes an edge that includes keys and keyways interlockable with at least a portion of keys and keyways of the display. In such an example, the keys and keyways of the display may be on a short edge or on a long edge of the display.

As an example, a system can include a first display that includes a first rectangular display panel and a first housing that includes a first rectangular frame that surrounds the first rectangular display panel, where a short edge of the first rectangular frame includes a first set of keys and keyways; and a second display that includes a second rectangular display panel and a second housing that includes a second rectangular frame that surrounds the second rectangular display panel, where a short edge of the second rectangular frame includes a second set of keys and keyways, where the first set of keys and keyways interlock with the second set of keys and keyways. In such an example, the first set of keys and keyways and the second set of keys and keyways can define a pivot axis for pivotal movement between the first display and the second display. In such an example, the first set of keys and keyways and the second set of keys and keyways can interlock to prevent translational movement between the first display and the second display.

As an example, a system can include a first housing that includes a first back surface and a first bridge recess in the first back surface of the first housing and a second housing that includes a second back surface and a second bridge recess in the second back surface of the second housing. In such an example, the system can include a bridge that includes a first portion that fits into the first bridge recess and a second portion that fits into the second bridge recess. As an example, a bridge may include electrical connectors that connect to a first electrical connector of a first bridge recess of a first display and a second electrical connector of a second bridge recess of a second display.

The term "circuit" or "circuitry" is used in the summary, description, and/or claims. As is well known in the art, the term "circuitry" includes all levels of available integration (e.g., from discrete logic circuits to the highest level of circuit integration such as VLSI, and includes programmable logic components programmed to perform the functions of an embodiment as well as general-purpose or special-purpose processors programmed with instructions to perform those functions) that includes at least one physical component such as at least one piece of hardware. A processor can be circuitry. Memory can be circuitry. Circuitry may be processor-based, processor accessible, operatively coupled to a processor, etc. Circuitry may optionally rely on one or more computer-readable media that includes computer-executable instructions. As described herein, a computer-readable medium may be a storage device (e.g., a memory chip, a memory card, a storage disk, etc.) and referred to as a computer-readable storage medium, which is non-transitory and not a signal or a carrier wave.

Figure 14:
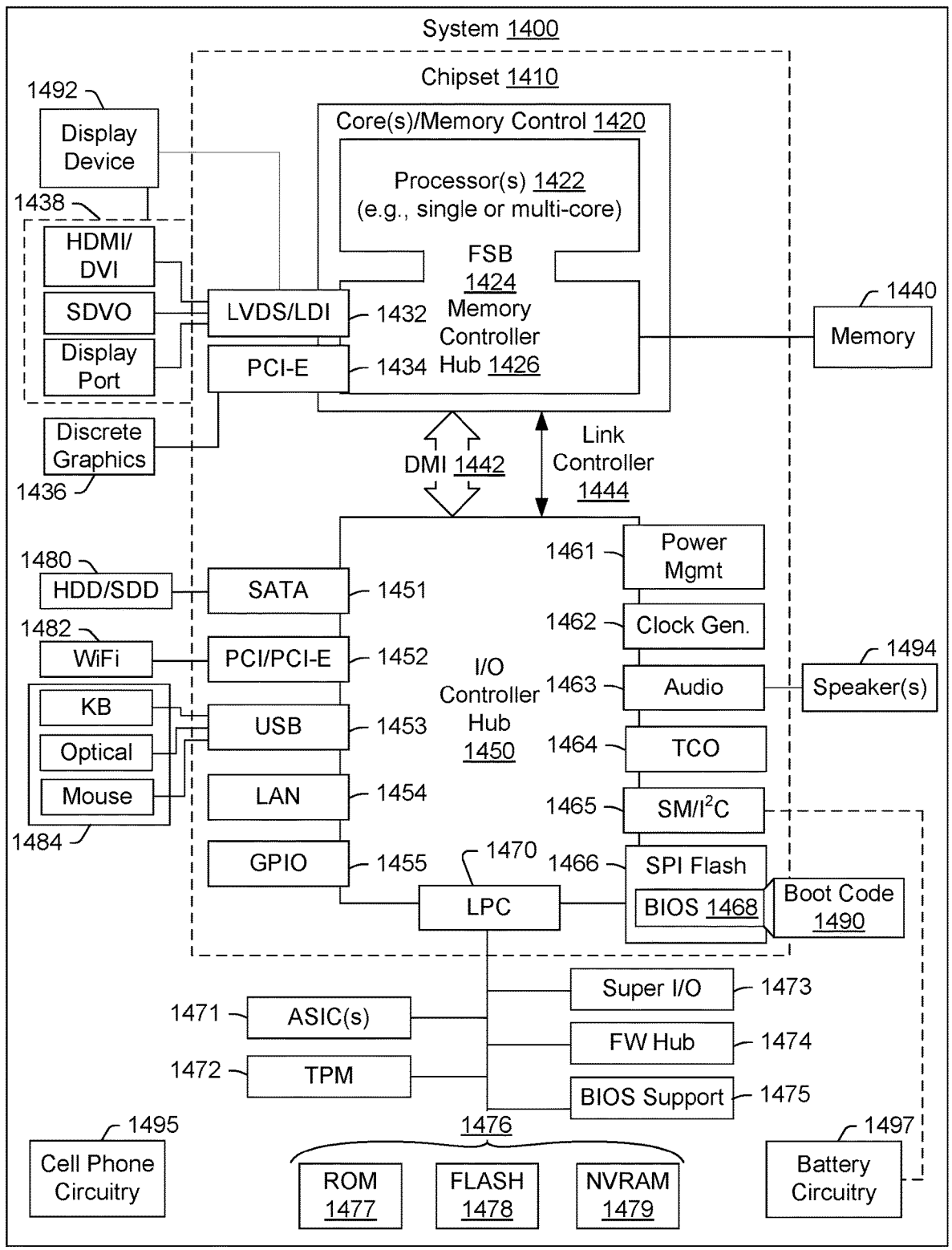
FIG. 14 is a diagram of an example of a system that includes one or more processors.

While various examples of circuits or circuitry have been discussed, FIG. 14 depicts a block diagram of an illustrative computer system 1400. The system 1400 may be a computer system, such as one of the ThinkCentre® or ThinkPad® series of personal computers sold by Lenovo (US) Inc. of Morrisville, NC, or a workstation computer system, such as the ThinkStation®, which are sold by Lenovo (US) Inc. of Morrisville, NC; however, as apparent from the description herein, a system, a device, an assembly, etc., or other machine may include other features or only some of the features of the system 1400.

As an example, a monitor or display may include features such as one or more of the features included in one of the LENOVO® IDEACENTRE® or THINKCENTRE® "all-in-one" (AIO) computing devices (e.g., sold by Lenovo (US) Inc. of Morrisville, NC). For example, the LENOVO® IDEACENTRE® A720 computing device includes an Intel® Core i7 processor, a 27 inch frameless multi-touch display (e.g., for HD resolution of 1920×1080), a NVIDIA® GeForce® GT 630M 2 GB graphics card, 8 GB DDR3 memory, a hard drive, a DVD reader/writer, integrated Bluetooth® and 802.11b/g/n Wi-Fi®, USB connectors, a 6-in-1 card reader, a webcam, HDMI in/out, speakers, and a TV tuner. As an example, an interlocking display may include at least some of the features of an AIO computing device, which can include at least some of the features of the system 1400.

As shown in FIG. 14, the system 1400 includes a so-called chipset 1410. A chipset refers to a group of integrated circuits, or chips, that are designed (e.g., configured) to work together. Chipsets are usually marketed as a single product (e.g., consider chipsets marketed under the brands INTEL®, AMD®, etc.).

In the example of FIG. 14, the chipset 1410 has a particular architecture, which may vary to some extent depending on brand or manufacturer. The architecture of the chipset 1410 includes a core and memory control group 1420 and an I/O controller hub 1450 that exchange information (e.g., data, signals, commands, etc.) via, for example, a direct management interface or direct media interface (DMI) 1442 or a link controller 1444. In the example of FIG. 14, the DMI 1442 is a chip-to-chip interface (sometimes referred to as being a link between a "northbridge" and a "southbridge").

The core and memory control group 1420 include one or more processors 1422 (e.g., single core or multi-core) and a memory controller hub 1426 that exchange information via a front side bus (FSB) 1424. As described herein, various components of the core and memory control group 1420 may be integrated onto a single processor die, for example, to make a chip that supplants the conventional "northbridge" style architecture.

The memory controller hub 1426 interfaces with memory 1440. For example, the memory controller hub 1426 may provide support for DDR SDRAM memory (e.g., DDR, DDR2, DDR3, etc.). In general, the memory 1440 is a type of random-access memory (RAM). It is often referred to as "system memory".

The memory controller hub 1426 further includes a low-voltage differential signaling interface (LVDS) 1432. The LVDS 1432 may be a so-called LVDS Display Interface (LDI) for support of a display device 1492 (e.g., a CRT, a flat panel, a projector, etc.). A block 1438 includes some examples of technologies that may be supported via the LVDS interface 1432 (e.g., serial digital video, HDMI/DVI, display port). The memory controller hub 1426 also includes one or more PCI-express interfaces (PCI-E) 1434, for example, for support of discrete graphics 1436. Discrete graphics using a PCI-E interface has become an alternative approach to an accelerated graphics port (AGP). For example, the memory controller hub 1426 may include a 16-lane (×16) PCI-E port for an external PCI-E-based graphics card. A system may include AGP or PCI-E for support of graphics. As described herein, a display may be a sensor display (e.g., configured for receipt of input using a stylus, a finger, etc.). As described herein, a sensor display may rely on resistive sensing, optical sensing, or other type of sensing.

The I/O hub controller 1450 includes a variety of interfaces. The example of FIG. 14 includes a SATA interface 1451, one or more PCI-E interfaces 1452 (optionally one or more legacy PCI interfaces), one or more USB interfaces 1453, a LAN interface 1454 (more generally a network interface), a general purpose I/O interface (GPIO) 1455, a low-pin count (LPC) interface 1470, a power management interface 1461, a clock generator interface 1462, an audio interface 1463 (e.g., for speakers 1494), a total cost of operation (TCO) interface 1464, a system management bus interface (e.g., a multi-master serial computer bus interface) 1465, and a serial peripheral flash memory/controller interface (SPI Flash) 1466, which, in the example of FIG. 14, includes BIOS 1468 and boot code 1490. With respect to network connections, the I/O hub controller 1450 may include integrated gigabit Ethernet controller lines multiplexed with a PCI-E interface port. Other network features may operate independent of a PCI-E interface.

The interfaces of the I/O hub controller 1450 provide for communication with various devices, networks, etc. For example, the SATA interface 1451 provides for reading, writing or reading and writing information on one or more drives 1480 such as HDDs, SDDs or a combination thereof. The I/O hub controller 1450 may also include an advanced host controller interface (AHCI) to support one or more drives 1480. The PCI-E interface 1452 allows for wireless connections 1482 to devices, networks, etc. The USB interface 1453 provides for input devices 1484 such as keyboards (KB), one or more optical sensors, mice and various other devices (e.g., microphones, cameras, phones, storage, media players, etc.). On or more other types of sensors may optionally rely on the USB interface 1453 or another interface (e.g., $I^2C$, etc.). As to microphones, the system 1400 of FIG. 14 may include hardware (e.g., audio card) appropriately configured for receipt of sound (e.g., user voice, ambient sound, etc.).

In the example of FIG. 14, the LPC interface 1470 provides for use of one or more ASICs 1471, a trusted platform module (TPM) 1472, a super I/O 1473, a firmware hub 1474, BIOS support 1475 as well as various types of memory 1476 such as ROM 1477, Flash 1478, and non-volatile RAM (NVRAM) 1479. With respect to the TPM 1472, this module may be in the form of a chip that can be used to authenticate software and hardware devices. For example, a TPM may be capable of performing platform authentication and may be used to verify that a system seeking access is the expected system.

The system 1400, upon power on, may be configured to execute boot code 1490 for the BIOS 1468, as stored within the SPI Flash 1466, and thereafter processes data under the control of one or more operating systems and application software (e.g., stored in system memory 1440). An operating system may be stored in any of a variety of locations and accessed, for example, according to instructions of the BIOS 1468. Again, as described herein, a satellite, a base, a server or other machine may include fewer or more features than shown in the system 1400 of FIG. 14. Further, the system 1400 of FIG. 14 is shown as optionally include cell phone circuitry 1495, which may include GSM, CDMA, etc., types of circuitry configured for coordinated operation with one or more of the other features of the system 1400. Also shown in FIG. 14 is battery circuitry 1497, which may provide one or more battery, power, etc., associated features (e.g., optionally to instruct one or more other components of the system 1400). As an example, a SMBus may be operable via a LPC (see, e.g., the LPC interface 1470), via an I²C interface (see, e.g., the SM/I²C interface 1465), etc.

Although examples of methods, devices, systems, etc., have been described in language specific to structural features and/or methodological acts, it is to be understood that the subject matter defined in the appended claims is not necessarily limited to the specific features or acts described. Rather, the specific features and acts are disclosed as examples of forms of implementing the claimed methods, devices, systems, etc.

What is claimed is:

1. A display comprising:
    a rectangular display panel; and
    a housing that comprises a rectangular frame that surrounds the rectangular display panel, wherein a short edge of the rectangular frame comprises keys and keyways, wherein the keys and keyways comprise a stack of planar extensions and planar slots, wherein each of the planar extensions comprises a rounded end, and wherein each of the planar slots comprises a rounded seat.

2. The display of claim 1, wherein the stack defines a pivot axis for pivotal movement of the display without translational movement of the display for interlocking contact between the short edge and a short edge of another instance of the display.

3. The display of claim 1, comprising a short edge cover.

4. The display of claim 3, wherein the short edge cover interlocks with at least one of the keys, with at least one of the keyways or with at least one of the keys and at least one of the keyways.

5. The display of claim 4, wherein the short edge cover comprises an elastomer.

6. The display of claim 1, wherein the housing comprises a back surface and a bridge recess in the back surface of the housing.

7. The display of claim 6, wherein the bridge recess comprises an electrical connector.

8. The display of claim 6, comprising a bridge, wherein a portion of the bridge is receivable in the bridge recess.

9. The display of claim 8, wherein the bridge comprises at least two electrical connectors.

10. The display of claim 1, comprising an accessory that comprises an edge that comprises keys and keyways interlockable with at least a portion of the keys and keyways of the short edge.

11. The display of claim 1, wherein each of the planar extensions comprises the rounded end as a convex rounded end, and wherein each of the planar slots comprises the rounded seat as a concave rounded seat.

12. A system comprising:
    a first display that comprises a first rectangular display panel and a first housing that comprises a first rectangular frame that surrounds the first rectangular display panel, wherein a short edge of the first rectangular frame comprises a first set of keys and keyways; and
    a second display that comprises a second rectangular display panel and a second housing that comprises a second rectangular frame that surrounds the second rectangular display panel, wherein a short edge of the second rectangular frame comprises a second set of keys and keyways, wherein the first set of keys and keyways interlock with the second set of keys and keyways,
    wherein the first housing comprises a first back surface and a first bridge recess in the first back surface of the first housing and the second housing comprises a second back surface and a second bridge recess in the second back surface of the second housing for a bridge that comprises electrical connectors that connect to a first electrical connector of the first bridge recess and a second electrical connector of the second bridge recess.

13. The system of claim 12, wherein the first set of keys and keyways and the second set of keys and keyways define a pivot axis for pivotal movement between the first display and the second display.

14. The system of claim 13, wherein the first set of keys and keyways and the second set of keys and keyways interlock to prevent translational movement between the first display and the second display.

15. The system of claim 12, comprising the bridge, wherein the bridge comprises a first portion that fits into the first bridge recess and a second portion that fits into the second bridge recess.

16. The system of claim 12, wherein the first set of keys and keyways comprises a stack of planar extensions and planar slots and wherein the second set of keys and keyways comprises another stack of planar extensions and planar slots.

17. The system of claim 16, wherein each of the planar extensions comprises a rounded end and wherein each of the planar slots comprises a rounded seat.

18. A display comprising:
    a rectangular display panel; and
    a housing that comprises a rectangular frame that surrounds the rectangular display panel, wherein a short edge of the rectangular frame comprises keys and keyways, and wherein the housing comprises a back surface and a bridge recess in the back surface of the housing, wherein the bridge recess comprises an electrical connector.

19. The display of claim 18, comprising a bridge, wherein a portion of the bridge is receivable in the bridge recess.

20. The display of claim 19, wherein the bridge comprises at least two electrical connectors.

\* \* \* \* \*